United States Patent [19]

Chen et al.

[11] Patent Number: 4,671,849

[45] Date of Patent: Jun. 9, 1987

[54] METHOD FOR CONTROL OF ETCH PROFILE

[75] Inventors: Lee Chen; Gangadhara S. Mathad, both of Poughkeepsie, N.Y.

[73] Assignee: International Business Machines Corporation, Armonk, N.Y.

[21] Appl. No.: 730,976

[22] Filed: May 6, 1985

[51] Int. Cl.⁴ .................... H01L 21/308; C23F 1/02
[52] U.S. Cl. .................. 156/643; 156/644; 156/646; 156/653; 156/657; 156/662; 204/192.34
[58] Field of Search ............... 156/643, 644, 646, 653, 156/657, 662; 204/192 E; 430/313, 317, 323

[56] References Cited

U.S. PATENT DOCUMENTS

| 3,940,506 | 2/1976 | Heinecke | 427/38 |
| 4,174,251 | 11/1979 | Paschke | 156/643 |
| 4,283,249 | 11/1981 | Ephrath | 204/192 E |
| 4,324,611 | 4/1982 | Vogel et al. | 156/643 |
| 4,409,319 | 10/1983 | Colacino et al. | 156/643 X |
| 4,417,947 | 11/1983 | Pan | 156/643 |
| 4,511,430 | 4/1985 | Chen et al. | 156/646 X |

FOREIGN PATENT DOCUMENTS 3306703 8/1984 Fed. Rep. of Germany ...... 156/643

144135 8/1984 Japan .................. 156/643

OTHER PUBLICATIONS

IBM Technical Disclosure Bulletin, vol. 21, No. 10, 3/1979, "Gas Mixing to Prevent Polymer Formation During Reaction Ion Etching", Bonder & Crimi.
IBM Technical Disclosure Bulletin, vol. 20, No. 4, 9/1977, "Sidewall Tailoring Using Two Different Reactive Ion Etchants in Succession", Bartush, Colacino, Gati.

Primary Examiner—S. Leon Bashore
Assistant Examiner—Thomas M. Lithgow
Attorney, Agent, or Firm—Douglas A. Lashmit

[57] ABSTRACT

A method for precisely controlling the profile of an opening etched in a layer of material, for example, an insulating layer. In one embodiment, wherein a silicon dioxide layer is reactive ion etched through a photoresist mask, the concentration of a reactive species in an etchant gas is changed during the etching process to change the slope of the opening, the upper sidewall portion of the opening having a shallow slope and the lower sidewall portion of the opening having a steep slope. The final slope of the opening formed by this method is independent of the initial slopes of the images developed in the photoresist mask.

3 Claims, 5 Drawing Figures

METHOD FOR CONTROL OF ETCH PROFILE

BACKGROUND OF THE INVENTION

This invention relates generally to etching processes and in particular to a method for controlling the profile of an opening etched in a layer of material.

In the fabrication of semiconductor integrated circuit devices vias or openings are formed in an insulating layer prior to metallization to provide contacts to underlying regions. It is preferable that these openings have a rounded profile in order to minimize the possibility of defects in the overlying metal layer. One problem is a step-coverage defect, which sometimes occurs when a metal layer is formed over an opening having a steep profile and causes a discontinuity in the conductor formed by the metal layer. Such steep openings, that is, openings having nearly vertical sidewalls, typically occur when an insulating layer is anisotropically etched, for example by a plasma or reactive ion etching process.

The insulating layer via profile becomes more important as the number of metal interconnection layers increases and the thickness of each metal layer decreases.

One method for providing an opening having a sloped profile is to form a predetermined slope in the sidewalls of the openings in a mask layer overlying the insulating layer to be etched. The sidewall profile in the mask layer, typically a photoresist, is then transferred to the opening in the insulating layer during the etching process. A disadvantage is that this method requires an extra high temperature bake step to form the desired opening profile in the mask layer. This step to obtain a predetermined slope in the mask layer is not easily controlled, thus resulting in an etch profile that is difficult to repeat from wafer to wafer.

Another method of providing a sloped sidewall profile during anisotropic plasma or reactive ion etching is to vary the ion bombardment energy. However, this requires a complex triode or a flexible diode reactor and it is often difficult to precisely control the profile.

The prior art teaches various methods of tailoring the reactive etchant species used in plasma etching to achieve a particular etch rate and selectivity relative to the layer being etched, the underlying layer and the photoresist mask layer. For example, U.S. Pat. No. 4,174,251 to Paschke describes a two step etching process for a low pressure plasma reactor wherein a silicon nitride layer is etched through a hydrocarbon photoresist mask without destroying the mask layer. The process includes a pre-etch step using a high plasma power level and a 95:5 $CF_4:O_2$ etchant gas to etch halfway through the silicon nitride layer, followed by a main etch step at a lower power level, using a 50:50 $CF_4:O_2$ etchant gas to etch the remainder of the silicon nitride layer.

U.S. Pat. No. 3,940,506 to Heinecke discloses a method of adjusting the concentration of a reducing species, such as hydrogen, in a plasma to control the relative etch rates of silicon and silicon dioxide or silicon nitride, particularly for use in a low pressure plasma reactor. Hydrogen is used to control the selectivity and may be added to the $CF_4$ etchant gas mixture by using a partially fluorine substituted hydrocarbon such as $CHF_3$.

U.S. Pat. No. 4,324,611 to Vogel et al. describes a method for tailoring a reagent gas mixture to achieve a high etch rate, high selectivity and low breakdown of photoresist in a single wafer, high power, high pressure reactor. The disclosed reagent gas mixture includes a primary etching gas consisting of a pure carbon-fluorine, and a secondary gas containing hydrogen to control the selectivity of the etch. A tertiary gas containing helium may be included to prevent the breakdown of the photoresist mask layer. In one embodiment for plasma etching silicon dioxide or silicon nitride overlying silicon, the primary gas is $C_2F_6$ and the secondary gas is $CHF_3$.

SUMMARY OF THE INVENTION

It is therefore an object of the present invention to provide a method for controlling the profile of an etched opening in a layer of material.

Another object of the invention is to provide a method for plasma etching an insulating layer to provide an opening having a desired profile.

Yet another object is to provide a method for controlling the profile of an opening in an insulating layer during plasma etching by changing the percentage gas concentration of a reactive species at a predetermined point during the etching process.

These and other objects are achieved in accordance with one embodiment of the present invention by employing a gas mixture comprising $CF_4$ and $CHF_3$ in a plasma reactor having a short reactive species residence time. For etching a silicon dioxide layer overlying a silicon body through a hydrocarbon photoresist mask layer, the initial percentage gas concentration of $CHF_3$ is selected to achieve a silicon dioxide:photoresist etch rate ratio that will result in a steep sloped sidewall. After etching through a portion of the silicon dioxide layer, the percentage gas concentration of $CHF_3$ is decreased to decrease the silicon dioxide:photoresist etch rate ratio and cause a shallow sloped sidewall for the remaining portion of the silicon dioxide layer. An opening having the desired profile, i.e., a shallow upper portion and a steep lower portion, is thereby obtained.

BRIEF DESCRIPTION OF THE DRAWINGS

Other objects and many of the attendant advantages of the present invention will be better understood by reference to the following detailed description in conjunction with the accompanying drawings, wherein.

DETAILED DESCRIPTION OF THE PREFERRED EMBODIMENT

Figure 1:
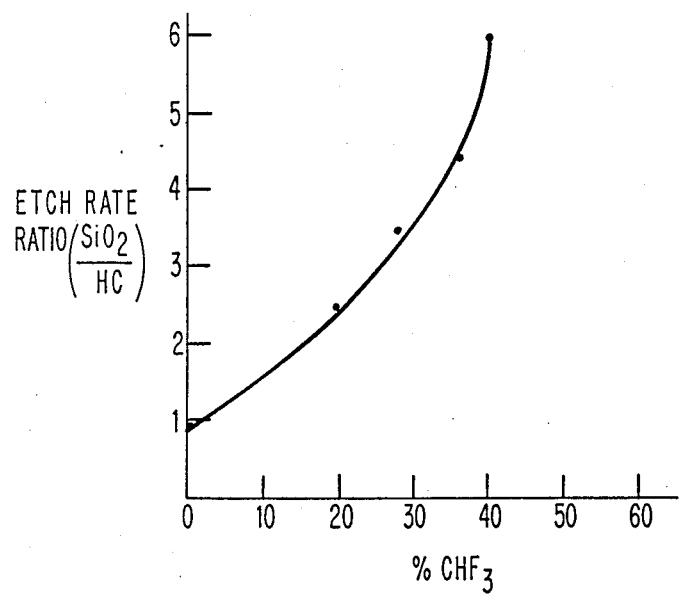
FIG. 1 is a graphical representation of the insulating layer/photoresist etch rate ratio as a function of the percentage gas concentration of $CHF_3$ according to the method of the present invention.
Figure 2:
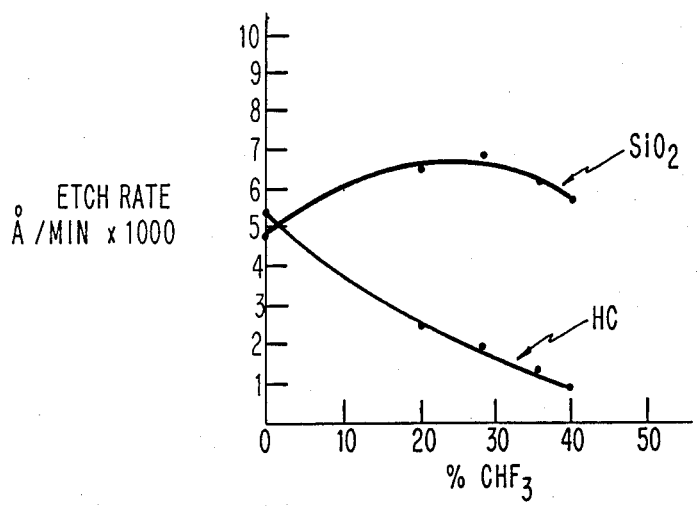
FIG. 2 is a graphical representation of the respective etch rates of the insulating and photoresist layers as a function of the percentage gas concentration of $CHF_3$.

It has been found, in the reactive plasma etching of an insulating layer such as silicon dioxide that when pure $CF_4$ gas is employed as the reactive species there is no undercutting of a hydrocarbon (HC) photoresist. Also, the etch rate ratio of silicon dioxide to HC photoresist is approximately 0.97:1. Further, when a secondary gas such as CHF$_3$ is added to the CF$_4$ the etch rate ratio increases, as shown in FIG. 1. The actual etch rates of silicon dioxide and the HC photoresist are plotted in FIG. 2 as a function of the gas concentration of CHF$_3$, expressed as a percentage of the CHF$_3$+CF$_4$ mixture. As shown, the etch rate of silicon dioxide varies over a relatively small range while the etch rate of the HC photoresist substantially decreases as CHF$_3$ is added to the etchant gas mixture.

Figure 3:
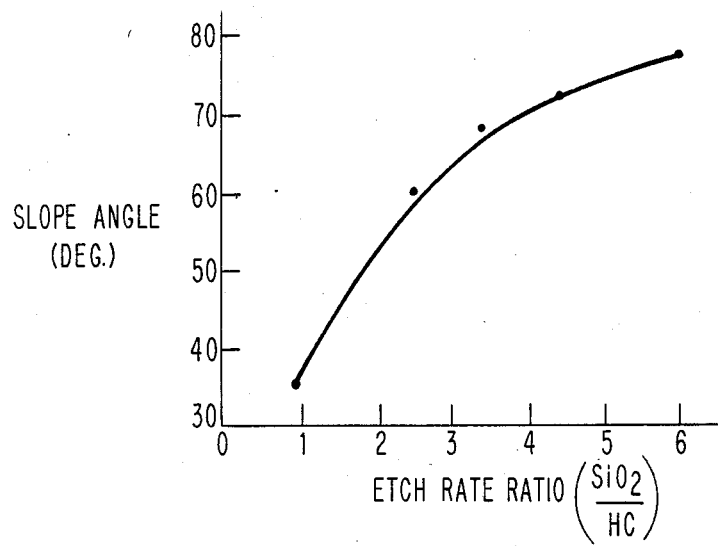
FIG. 3 is a graphical representation of the resulting slope angle of the etched opening, with respect to the horizontal, as a function of the insulating layer/photoresist etch rate ratio.

As the silicon dioxide:photoresist (SiO$_2$:HC) etch rate ratio is varied, as shown in FIG. 3, the sidewall slope angle of the final etched opening in the silicon dioxide layer also varies. Thus, a low SiO$_2$:HC etch rate ratio results in a small sidewall slope angle with respect to the horizontal, i.e., a shallow etched opening profile, whereas a high etch rate ratio results in a large sidewall slope angle or a steep etched opening profile.

Figure 4A:
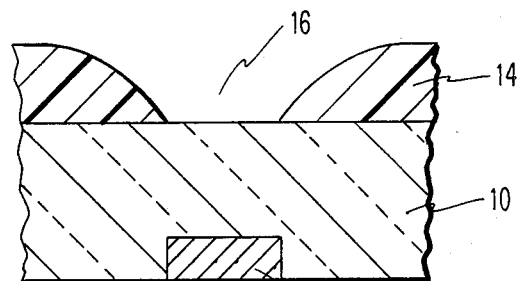
FIG. 4A is a cross-sectional view of a portion of a masked insulating layer prior to etching.
Figure 4B:
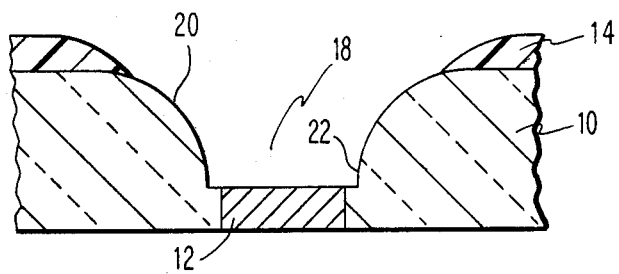
FIG. 4B is a cross-sectional view of the masked insulating layer of FIG. 4A after the etching process according to the present invention is completed.

Referring now to FIGS. 4A and 4B, the relationship between the percentage CHF$_3$ concentration in the etchant gas and the slope angle of the etched opening sidewall is used to control the opening profile. FIG. 4A shows a portion of an insulating layer 10, for example, silicon dioxide which may be formed on a silicon body (not shown) or other underlying layer. Included in layer 10, for purposes of illustration, is a conductor 12 which may be a portion of a metallic interconnection layer. Overlying layer 10 is a mask layer 14, for example, a hydrocarbon photoresist, including mask openings 16 through which layer 10 will be etched. Mask opening 16 can be formed by any of a number of well known lithographic processes.

FIG. 4B shows layer 10 after the completion of the present etching process wherein an opening 18 has been formed. The lower sidewall portion 22 of opening 18 is formed by using an etchant having a high percentage CHF$_3$ gas concent (high ERR) during the initial phase of the etching process. The choice of initial ERR depends on the slope of the profiles of the developed images in the resist mask 14. A shallow resist profile would necessitate the use of an etchant gas with a higher ERR. Referring again to FIGS. 1 and 3, the etchant has a high etch rate ratio of SiO$_2$:HC and therefore causes the sidewall of opening 18 to initially have a large slope angle with respect to the horrzontal, i.e., a steep angle. In other words, a smaller thickness of the photoresist layer 14 is etched as compared to the thickness of the SiO$_2$ layer 10 etched during the initial etching phase.

After a portion, for example, one-half, of layer has been etched the percentage CHF$_3$ gas concentration is decreased. The etch rate ratio is similarly decreased resulting in a smaller slope angle for the upper sidewall portion 20 of opening 18 as compared to lower portion 22. That is, since a greater thickness of photoresist layer 14 is etched than during the initial etching phase, a larger surface area of SiO$_2$ layer 10 will be uncovered during the final etching phase, causing the upper portion 20 of layer 10 to have a shallower final etched slope than the lower portion 22. In the example shown in FIG. 4B, the etching process is completed when the upper surface of conductor 12 is fully exposed.

It will be apparent to those skilled in the art that other reactive gases, which can readily form polymers, may be used in the present process in place of CHF$_3$, for example, C$_2$F$_6$ or C$_3$F$_8$.

As an illustrative example of the present process, a silicon wafer having a 2.0 micron SiO$_2$ layer thereon was etched through a 20,000 Angstrom diameter opening in a photoresist layer approximately 15,000 Angstroms thick. The process was carried out in a single wafer, planar plasma reactor at an RF frequency of about 13.56 MHz., an RF power of about 200 watts and a pressure of about 1.0 torr. The initial CHF$_3$ gas concentration was about 25% and the final CHF$_3$ concentration was about 5%, resulting in a lower sidewall slope of about 85 degrees and an upper sidewall slope of about 30 degrees. The entire etching process took approximately two minutes. This process is particularly adaptable to single wafer, high pressure plasma reactors having a relatively small plasma chamber volume, for example, less than about 40 cc. The small chamber volume results in a low residence time of approximately 0.1 sec and permits the precise control of the profile in the opening, since the CHF$_3$ concentration in the reactor can be quickly changed causing an extremely fast change in the etch rate ratio. Under the above-described process conditions this change has been observed to occur in less than 0.5 seconds.

Since the etchant gas concentration is changed abruptly during the etch cycle, a slight discontinuity in the etched profile is observed. Although this will not affect step coverage during subsequent metal deposition, the discontinuity can be avoided and the smoothly varying profile as shown in FIG. 4B can be achieved by continuously varying the CHF$_3$ concentration. This can be readily carried out by using, for example, a microprocessor or an analog control loop which will ramp down the percentage of CHF$_3$ from a high to a low value.

There has thus been provided by the present invention a reactive plasma etching process wherein the profile of an opening formed in an insulating layer may be precisely controlled, regardless of the original slope in the mask layer.

Obviously, many modifications and variations of the present process will become apparent to those skilled in the art given the benefit of the foregoing disclosure. It is to be understood that such modifications and variations may be made without departing from the spirit and scope of the present invention as defined by the appended claims.

What is claimed is:

1. A method for etching openings having a desired sidewall profile in a silicon dioxide layer, comprising:
    forming a photoresist mask layer on said silicon dioxide layer, said mask layer having an opening therethrough at the desired location of each opening to be etched in said silicon dioxide layer;
    plasma etching said silicon dioxide and photoresist layers in an etchant gas consisting essentially of CF$_4$ and CHF$_3$; and
    decreasing the percentage gas configuration of CHF$_3$ during said plasma etching from an initial concentration greater than about 25% by volume to form an etched opening in said silicon dioxide layer having a shallower sidewall slope at its upper portion than the slope at its lower portion.

2. The method of claim 1 wherein the final percentage gas concentration of CHF$_3$ is between about 5% and 25% by volume.

3. The method of claim 2 wherein said plasma etching is performed in a plasma reactor having an active volume less than about 40 cc., at an RF power of at least about 200 watts and a pressure of at least about one torr.

* * * * *